United States Patent
Kim

(10) Patent No.: US 9,312,868 B2
(45) Date of Patent: Apr. 12, 2016

(54) CLOCK PHASE ADJUSTING CIRCUIT AND SEMICONDUCTOR DEVICE INCLUDING THE SAME

(71) Applicant: SK hynix Inc., Gyeonggi-do (KR)

(72) Inventor: Dae-Suk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/075,703

(22) Filed: Nov. 8, 2013

(65) Prior Publication Data

US 2014/0368243 A1    Dec. 18, 2014

(30) Foreign Application Priority Data

Jun. 18, 2013   (KR) .................. 10-2013-0069550

(51) Int. Cl.
  *H03L 7/06*    (2006.01)
  *H03L 7/197*    (2006.01)
(52) U.S. Cl.
  CPC ................... *H03L 7/1978* (2013.01)
(58) Field of Classification Search
  CPC ..... H03L 7/0814; H03L 7/0812; H03L 7/087; H03L 2207/02; G11C 7/22
  USPC .......................................... 327/141, 156, 158
  See application file for complete search history.

(56) References Cited

U.S. PATENT DOCUMENTS

| 8,144,531 | B2 | 3/2012 | Choi et al. | |
| 2011/0204941 | A1* | 8/2011 | Lee | 327/158 |
| 2011/0248752 | A1* | 10/2011 | Willey et al. | 327/117 |
| 2012/0062294 | A1* | 3/2012 | Choi et al. | 327/158 |
| 2013/0229214 | A1* | 9/2013 | Ichida | 327/158 |

FOREIGN PATENT DOCUMENTS

KR   1020110076298   7/2011

* cited by examiner

*Primary Examiner* — Diana J Cheng
(74) *Attorney, Agent, or Firm* — IP & T Group LLP

(57) ABSTRACT

A semiconductor device includes a buffer suitable for receiving an input signal, a clock buffer suitable for receiving a clock, a delay locked loop (DLL) suitable for delaying the clock to generate a delay locked clock, a code generation unit suitable for generating a digital code corresponding to 1/N of the clock cycle where N is an integer equal to or more than two, a delay unit suitable for delaying the clock corrected by the DLL by a value corresponding to the digital code to output a delayed clock, and a strobing unit suitable for strobing the input signal using the delayed clock.

12 Claims, 8 Drawing Sheets

FIG. 1
(PRIOR ART)
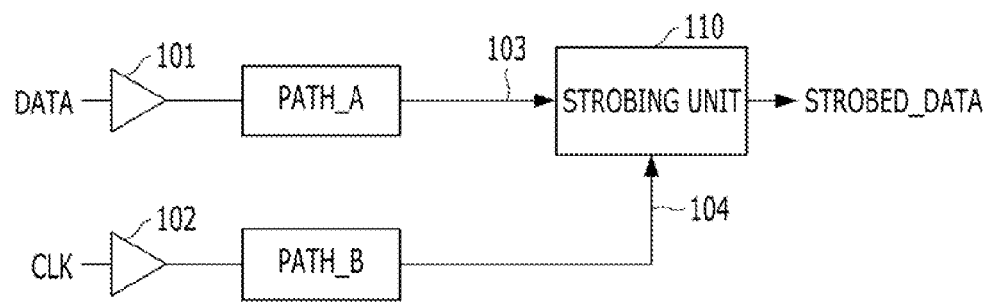
FIG. 2A
(PRIOR ART)
FIG. 2B
(PRIOR ART)
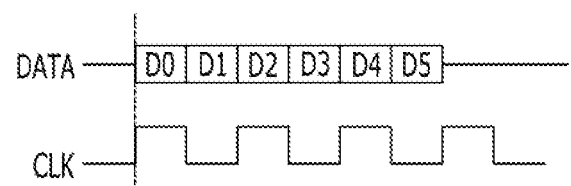
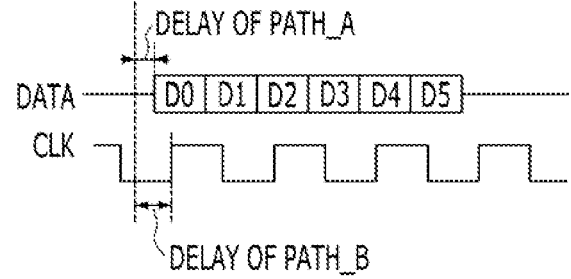

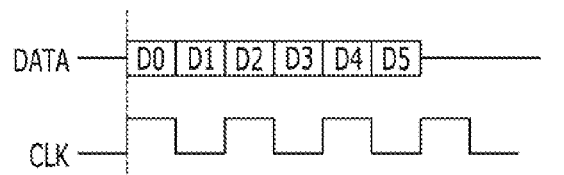
FIG. 4A (PRIOR ART)
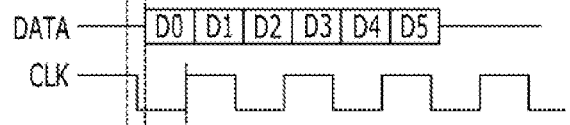
FIG. 4B (PRIOR ART)
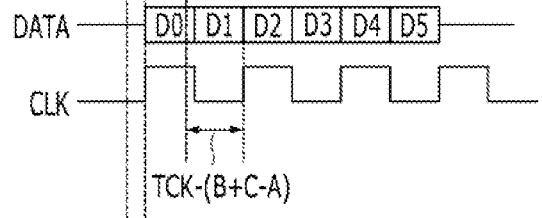
FIG. 4C (PRIOR ART)
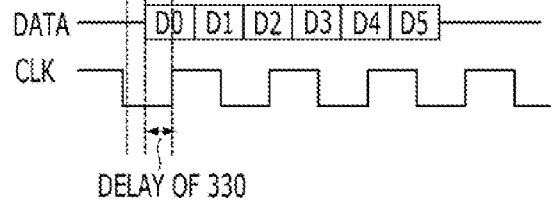
FIG. 4D (PRIOR ART)
FIG. 5
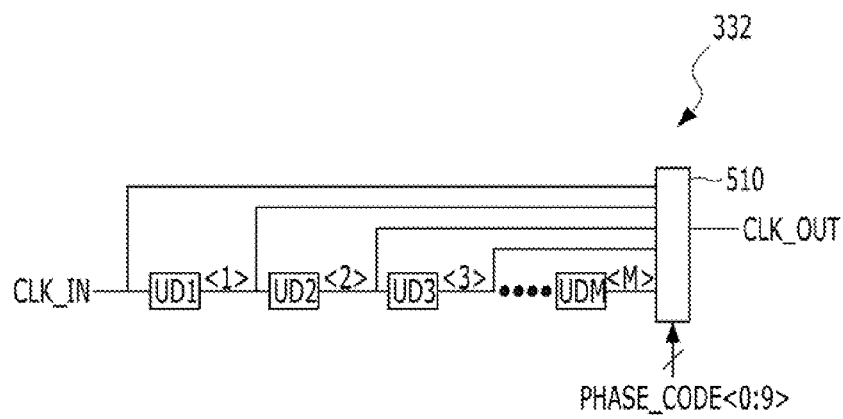

US 9,312,868 B2

CLOCK PHASE ADJUSTING CIRCUIT AND SEMICONDUCTOR DEVICE INCLUDING THE SAME

CROSS-REFERENCE TO RELATED APPLICATIONS

The present application claims priority of Korean Patent Application No. 10-2013-0069550, filed on Jun. 18, 2013, which is incorporated herein by reference in its entirety.

BACKGROUND

1. Field

Exemplary embodiments of the present invention relate to a clock phase adjusting circuit and a semiconductor device including the same.

2. Description of the Related Art

In order for semiconductor devices to exchange a signal (data) at high speed, the semiconductor devices may require a clock for normally recognizing the signal (data), that is, a strobe signal. Thus, when exchanging a signal at high speed, the semiconductor devices also exchange a clock as well as the signal.

FIG. 1 is a block diagram illustrating a configuration to receive data and a clock for strobing the data in a semiconductor device. FIGS. 2A and 2B are timing diagrams illustrating the phases of the data and the clock.

Referring to FIG. 1, data DATA are inputted through a data buffer 101 and then transmitted to a strobing unit 110 through a first path PATH_A. The first path PATH_A may include lines and circuits on a path through which the data DATA inputted through the data buffer 101 are transmitted to the strobing unit 110.

Furthermore, a clock CLK for strobing the data DATA is inputted through a clock buffer 102 and then transmitted to the strobing unit 110 through a second path PATH_B. The second path PATH_B may include lines and circuits on a path through which the clock CLK inputted through the clock buffer 102 is transmitted to the strobing unit 110.

The strobing unit 110 strobes the data DATA transmitted through the first path PATH_A in synchronization with the dock CLK transmitted through the second path PATH_B. The strobed data STROBED_DATA, that is, correctly-recognized data are transmitted to circuits (not illustrated) requiring the data inside the semiconductor device 100.

FIG. 2A illustrates the phases of the data DATA and the clock CLK on the data buffer 101 and the clock buffer 102, respectively. Referring to FIG. 2A, even data D0, D2 and D4 are aligned during logic high level periods of the clock CLK, and odd data D1, D3, and D5 are aligned during logic low level periods of the dock CLK.

FIG. 2B illustrates the phases of the data DATA and the clock CLK at a point 103 and a point 104. Since the data DATA are delayed through the first path PATH_A and the dock CLK is delayed through the second path PATH_B, the phases of the data DATA and the clock CLK deviate from the phases of the data DATA and the clock CLK of FIG. 2A. In order for the strobing unit 110 to recognize the data DATA with a sufficient margin, the edge of the clock CLK is necessary to be positioned at the center of the data DATA. Thus, there is a demand for technique for compensating for a phase difference caused by a path difference between the data DATA and the clock CLK and adjusting the phase of the clock CLK such that the edge of the clock CLK is positioned at the center of the data DATA.

SUMMARY

Various exemplary embodiments are directed to a technique for correcting a phase difference caused by a path difference between a clock and data (signal), and adjusting the phase of the clock such that the edge of the clock is positioned at the center of the data.

In accordance with an exemplary embodiment of the present invention, a semiconductor device includes a buffer suitable for receiving an input signal, a clock buffer suitable for receiving a clock, a delay locked loop (DLL) suitable for delaying the clock to generate a delay locked clock, a code generation unit suitable for generating a digital code corresponding to 1/N of the clock cycle where N is an integer equal to or more than two, a delay unit suitable for delaying the delay locked clock from the DLL by a value corresponding to the digital code to output a delayed clock, and a strobing unit configured to strobe the input signal using the delayed clock.

In accordance with an exemplary embodiment of the present invention, a semiconductor device includes a data buffer suitable for receiving an input signal, a clock buffer suitable for receiving a clock, a code generation unit suitable for generating a digital code corresponding to 1/N of the clock cycle where N is an integer equal to or more than two, a delay unit suitable for delaying the clock by a value corresponding to the digital code to output a delayed clock, a DLL suitable for delaying the delayed clock and to generate a delay locked clock, and a strobing unit suitable for strobing the input signal using the delay locked clock corrected by the DLL.

In accordance with an exemplary embodiment of the present invention, a clock phase adjusting circuit includes a code generation unit suitable for generating a digital code corresponding to 1/N of a clock cycle using the clock, where N is an integer equal to or more than two and a delay unit suitable for delaying the clock by a value corresponding to the digital code. Wherein the clock phase adjusting unit includes, a code generation unit suitable for generating the digital code corresponding to 1/N of the clock cycle where N is an integer equal to or more than two, and a delay unit suitable for delaying the delay locked clock from the DLL by a value corresponding to the digital code

BRIEF DESCRIPTION OF THE DRAWINGS

FIG. 1 is a block diagram illustrating a configuration to receive data and a clock for strobing the data in a semiconductor device.

FIGS. 2A and 2B are timing diagrams illustrating the phases of the data and the clock.

FIGS. 4A to 4D are timing diagrams for explaining the operations of a DLL and a clock phase adjusting circuit of FIG. 3.

FIG. 5 is a block diagram of a delay unit of the clock phase adjusting circuit shown in FIG. 3.

DETAILED DESCRIPTION

Figure 3:
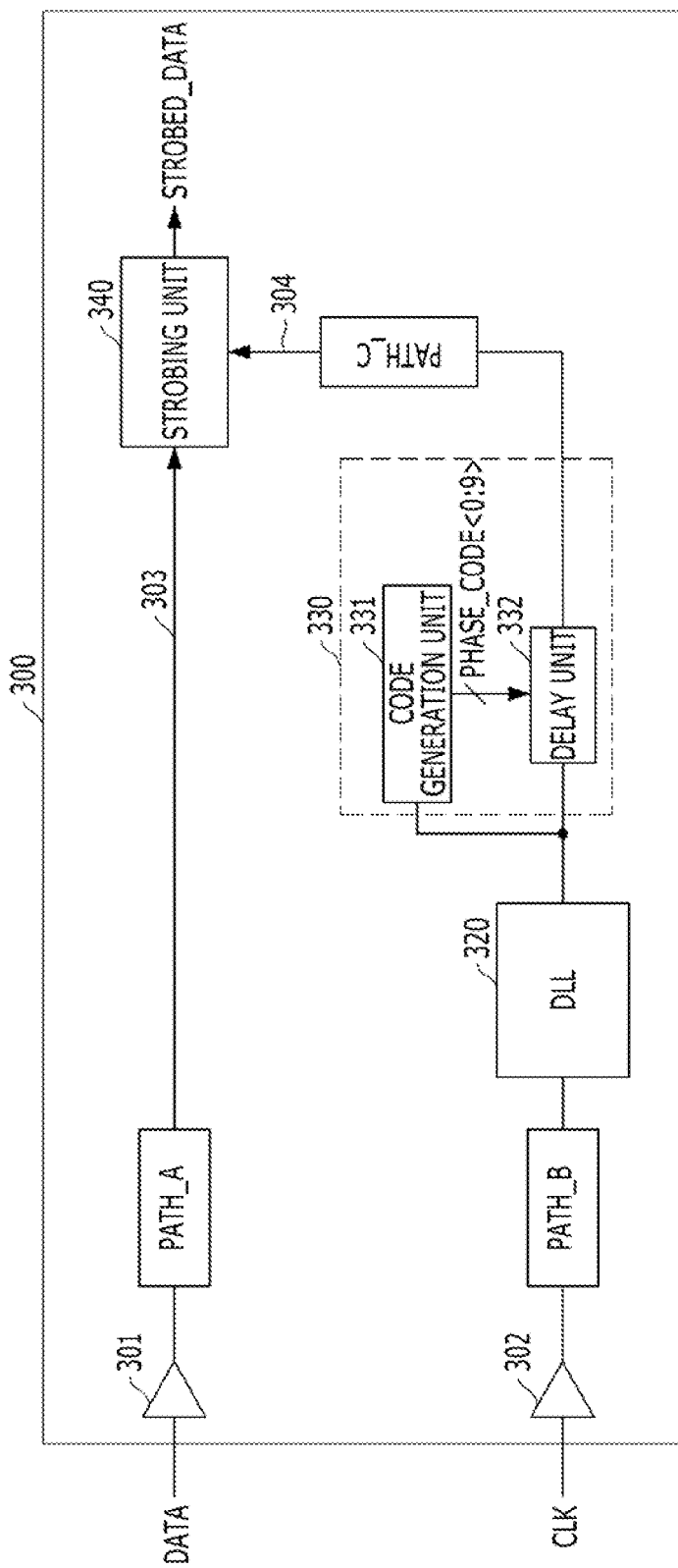
FIG. 3 is a block diagram of a semiconductor device in accordance with an exemplary embodiment of the present invention.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 3 is a block diagram of a semiconductor device 300 in accordance with an exemplary embodiment of the present invention.

Referring to FIG. 3, the semiconductor device 300 includes a data buffer 301, a clock buffer 302, a delay locked loop (DLL) 320, a clock phase adjusting circuit 330, and a strobing unit 340. The data buffer 301 serves to receive data (signal) DATA inputted from outside the semiconductor device 300. The data DATA inputted through the data buffer 301 are transmitted to the strobing unit 340 through a first path PATH_A. The first path PATH_A may include lines and/or circuits on a path through which the data DATA inputted through the data buffer 301 are transmitted to the strobing unit 340.

The clock buffer 302 serves to receive a clock CLK inputted from outside the semiconductor device 300, that is, a signal for strobing the data DATA. The data DATA inputted through the clock buffer 302 is transmitted to the DLL 320 through a second path PATH_B. The second path PATH_B may include lines and/or circuits on a path through which the clock CLK inputted through the clock buffer 302 is transmitted to the DLL 320.

The DLL 320 serves to compensate for a phase difference between the data DATA and the clock CLK, which may occur because the data DATA and the clock CLK are transmitted through different paths inside the semiconductor device 300. Inside the semiconductor device 300, the data DATA are delayed through the first path PATH_A, and the clock CLK is delayed through the second path PATH_B and a third path PATH_C. The DLL 320 delays the clock CLK by [(M*tCK)−(B+C−A)], and compensates for a phase difference between the data DATA and the clock CLK. Here, M represents an integer equal to or more than one, tCK represents one cycle of the clock CLK, B represents a delay value of the second path PATH_B, C represents a delay value of the third path PATH_C, and A represents a delay value of the first path PATH_A. The DLL 320 may be designed in various types such as a closed loop or open loop.

The clock phase adjusting circuit 330 serves to adjust the phase of the clock CLK such that the clock CLK is positioned at the center of the data DATA. For example, the clock phase adjusting circuit 330 may adjust the phase of the clock CLK by 90° or 180° such that the edge of the clock CLK is positioned at the center of the data DATA. The clock phase adjusting circuit 330 includes a code generation unit 331 and a delay unit 332. The code generation unit 331 generates a digital code PHASE_CODE<0:9> corresponding to 1/N of the clock cycle where N is an integer equal to or more than two, and the delay unit 332 delays the clock CLK outputted from the DLL 320 by a value corresponding to the digital code PHASE_CODE<0:9>. The digital code PHASE_CODE<0:9> may be obtained by quantizing a delay value corresponding to 1/N of the clock cycle by the delay value of a unit delay. The delay unit 332 includes a plurality of unit delays, and the number of unit delays used to delay the clock CLK is set according to the digital code PHASE_CODE<0:9>. The clock phase adjusting circuit 330 will be described below in more detail h reference to the drawings.

The clock CLK of which the phase is adjusted by the clock phase adjusting circuit 330 is transmitted to the strobing unit 340 through the third path PATH_C. The third path PATH_C may include lines and/or circuits through which the clock CLK is transmitted from the clock phase adjusting circuit 330 to the strobing unit 340.

The strobing unit 340 serves to strobe the data DATA transmitted through the first path PATH_A in synchronization with the clock CLK transmitted through the third path PATH_C. Then, the strobed data STROBED_DATA, that is, correctly-recognized data are transmitted to circuits (not illustrated) requiring the data DATA inside the semiconductor device 300. The DLL 320 corrects a phase difference caused by a path difference between the clock CLK and the data DATA, and the clock phase adjusting circuit 330 adjusts the phase of the clock CLK such that the edge of the clock CLK is positioned at the center of the data DATA. Thus, the strobing unit 340 strobes the data DATA with an optimal margin.

FIGS. 4A to 4D are timing diagrams for explaining the operations of the DLL 320 and the clock phase adjusting circuit 330.

FIG. 4A illustrates the data DATA and the clock CLK which are inputted to the data buffer 301 and the clock buffer 302 of FIG. 3. Referring to FIG. 4A, it can be seen that even data D0, D2, and D4 are aligned during logic high level periods of the clock CLK and odd data D1, D3, and D5 are aligned during logic low level periods of the clock CLK.

FIG. 4B illustrates the phases of the data DATA and the clock CLK at points 303 and 304, when supposing that the DLL 320 and the clock phase adjusting circuit 330 are not provided in FIG. 3. In this case, since the data DATA are delayed through the first path PATH_A and the clock CLK is delayed through the second path PATH_B and the third path PATH_C, that is, there is a phase difference between the data DATA and the clock CLK, and phase distortion occurs between to the data DATA and the clock CLK.

FIG. 4C illustrates the phases of the data DATA and the clock CLK at the points 303 and 304, when supposing that the clock phase adjusting circuit 330 is not provided in FIG. 3. Comparing FIG. 4B and FIG. 4C, the role of the DLL 320 may be understood. Since the DLL 320 delays the clock CLK by [(M+tCK)−(B+C−A)], the data DATA and the clock CLK at the points 303 and 304 may have the same phases as the data DATA and the clock CLK inputted to the data buffer 301 and the clock buffer 302. That is, a phase difference caused by a path difference between the data DATA and the clock CLK is corrected by the DLL 320.

FIG. 4D illustrates the phases of the data DATA and the clock CLK at the points 303 and 304 in FIG. 3. Comparing FIG. 4C and FIG. 4D, the role of the clock phase adjusting circuit 330 may be understood. Since the clock phase adjusting circuit 330 adjusts the phase of the dock CLK by 90° the edge of the clock CLK is positioned at the center of the data DATA as illustrated in FIG. 4D.

FIG. 5 is a block diagram of the delay unit 332 of the clock phase adjusting circuit 330 shown in FIG. 3.

Referring to FIG. 5, the delay unit 332 includes a plurality of unit delays UD1 to UDM and a selector 510.

The plurality of unit delays UD1 to UDM are connected in series and delay a clock CLK_IN inputted to the delay unit 332. Each of the unit delays UD1 to UDM has a delay value referred to as a unit delay value. The selector 510 serves to select one of the input clock CLK_IN and outputs <1> to <M> of the unit delays UD1 to UDM as an output clock CLK_OUT in response to the digital code PHASE_CODE<0:9>. For example, when the digital code PHASE_CODE 0:9> indicates 30 as a decimal number, the selector 510 selects the output <30> of the unit delay UD30 and outputs the selected output as the output clock CLK_OUT, and when the digital code PHASE_CODE<0:9> indicates 15 as a decimal number, the selector 510 selects the output <15> of the unit delay UD15 and outputs the selected output as the output clock CLK_OUT.

Depending on which signal the selector 510 selects and outputs, the delay value of the delay units UD1 to UDM may differ. For example, when the selector 510 selects the output <4> of the unit delay UD4, the output clock CLK_OUT corresponds to a clock obtained by delaying the input clock CLK_IN by four unit delay values, and when the selector 510 selects the output <25> of the unit delay UD25, the output clock CLK_OUT corresponds to a clock obtained by delaying the input clock CLK_IN by 25 unit delay values.

The delay unit 332 to delay the clock CLK by a value corresponding to the digital code PHASE_CODE<0:9> may be designed in different manners from that illustrated in FIG. 5.

Figure 6:
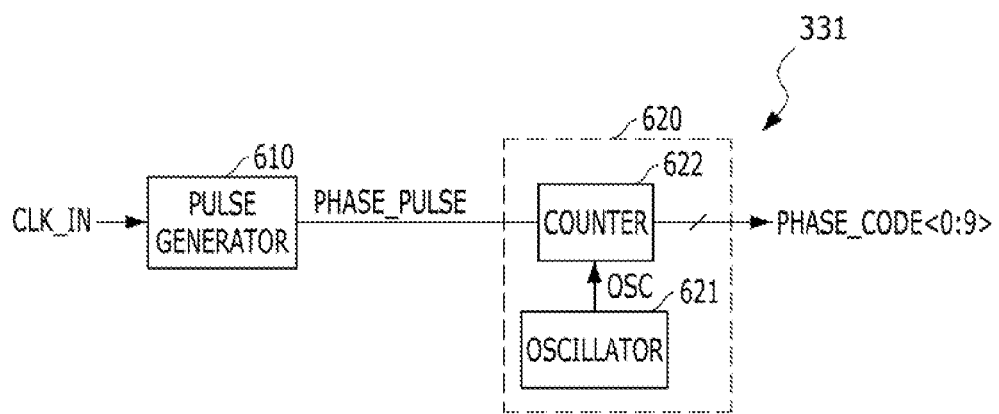
FIG. 6 is a block diagram illustrating a code generation unit of the clock phase adjusting circuit of FIG. 3 in accordance with a first exemplary embodiment of the present invention.

FIG. 6 is a block diagram illustrating a code generation unit 331 of the clock phase adjusting circuit 330 of FIG. 3 in accordance with a first exemplary embodiment of the present invention.

Referring to FIG. 6, the code generation unit 331 includes a pulse generator 610 and a quantizer 620.

The pulse generator 610 receives the clock CLK_IN and generates a pulse signal PHASE_PULSE having a pulse width corresponding to 1/N of the clock cycle. The width of the pulse signal PHASE_PULSE corresponds to the phase of the clock CLK, which the clock phase adjusting circuit 330 is to adjust. When the clock phase adjusting circuit 330 adjusts the phase of the clock CLK by 90°, N is 4, and when the clock phase adjusting circuit 330 adjusts the phase of the clock CLK by 180°, N is 2.

The quantizer 620 serves to quantize the pulse signal PHASE_PULSE by the unit delay value and generate a digital code. The digital code PHASE_CODE<0:9> indicates how many times larger the pulse width of the pulse signal PHASE_PULSE is than the unit delay value. The quantizer 620 includes an oscillator 621 and a counter 622. The oscillator 621 serves to generate a periodic wave OSC having one cycle equal to the unit delay value, and the counter 622 serves to count how many times the periodic wave OSC is activated while the pulse signal PHASE_PULSE is activated, and generate the digital code PHASE_CODE<0:9>.

Figure 7:
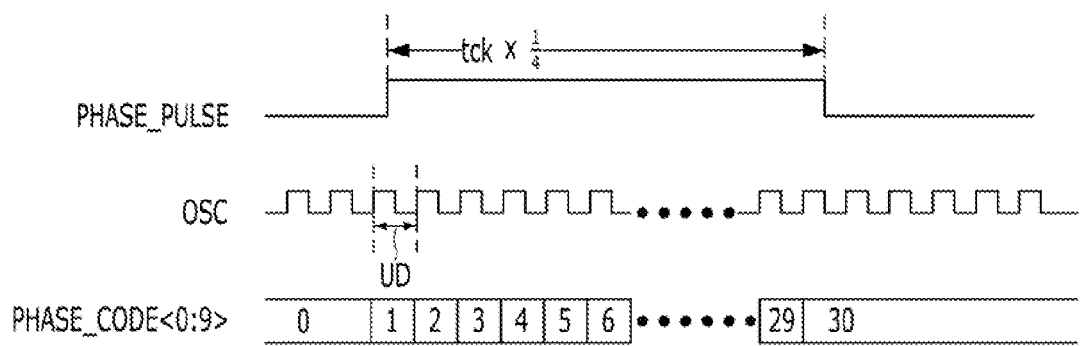
FIG. 7 is a timing diagram for explaining the operation of the code generation unit of FIG. 6.

FIG. 7 is a timing diagram for explaining the operation of the code generation unit 331 of FIG. 6. Referring to FIG. 7, the pulse generation unit 610 generates a pulse signal PHASE_PULSE having a pulse width corresponding to ¼ of the clock cycle. The oscillator 621 generates the periodic wave OSC having one cycle equal to the unit delay value UD. The counter 622 counts how many times the periodic wave OSC is activated while the pulse signal PHASE_PULSE is activated, and generates the digital code PHASE_CODE<0:9>. In FIG. 7, the value of the digital code PHASE_CODE<0:9> is generated as 30.

Figure 8:
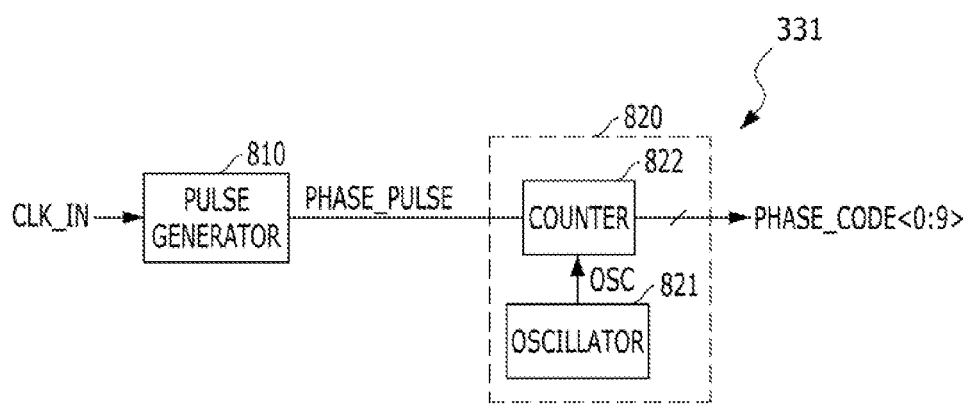
FIG. 8 is a block diagram illustrating a code generation unit in accordance with a second exemplary embodiment of the present invention.

FIG. 8 is a block diagram illustrating a code generation unit 331 in accordance with a second exemplary embodiment of the present invention. In the first exemplary embodiment, the code generation unit 331 of FIG. 6 may have an insufficient margin because the pulse signal PHASE_PULSE and the periodic wave OSC have a small width. In the second exemplary embodiment a method for increasing the margin will be described.

Referring to FIG. 8, the code generation unit 881 includes a pulse generator 810 and a quantizer 820.

The pulse generator 810 receives a clock CLK_IN and generates a pulse signal PHASE_PULSE having a pulse width A times larger than the clock cycle where A is an integer equal to or more than one. For example, the pulse generator 810 may generate a pulse signal PHASE_PULSE having a pulse width two times larger than the clock cycle. The pulse generator 810 of FIG. 8 may include the pulse generator 610 of FIG. 6 and a divider (not illustrated). For example, when the clock CLK_IN is divided by eight through the divider (that is, the cycle of the clock is extended eight times) and then passed through the pulse generator 610 of FIG. 6, the pulse signal PHASE_PULSE having a pulse width two times larger than the clock cycle may be generated.

The quantizer 820 serves to quantize the pulse signal PHASE_PULSE by [the unit delay value*B] and generate the digital code PHASE_CODE<0:9> (B=A*N). The digital code PHASE_CODE<0:9> generated in FIG. 8 has the same value as the digital code PHASE_CODE 0:9> generated in FIG. 6. This is because, although the pulse generator 810 generates the pulse signal PHAES_PULSE having a pulse width [A*N] times larger than the pulse generator 610, the quantizer 820 quantizes the pulse signal PHASE_PULSE by [the unit delay value*A*N]. The quantizer 820 includes an oscillator 821 and a counter 822. The oscillator 821 generates a periodic wave OSC having one cycle equal to [the unit delay value*A*N], and the counter 822 counts how many times the periodic wave OSC is activated while the pulse signal PHASE_PULSE is activated, and generates the digital code PHASE_CODE<0:9>.

Figure 9:
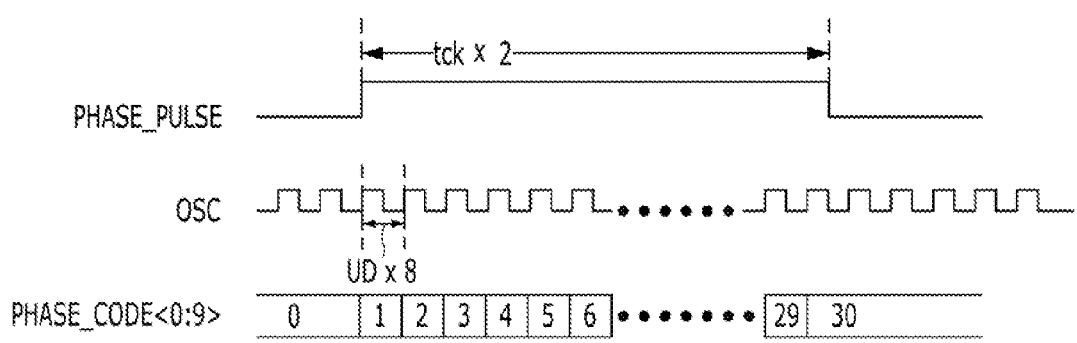
FIG. 9 is a timing diagram for explaining the operation of the code generation unit of FIG. 8.

FIG. 9 is a timing diagram for explaining the operation of the code generation unit 331 of FIG. 8. Referring to FIG. 9, the pulse generator 810 generates a pulse signal PHASE_PULSE having a pulse width two times larger than the clock cycle. Furthermore, the oscillator 821 generates a periodic wave OSC having one cycle equal to [the unit delay value*8]. The counter 822 counts how many times the periodic wave OSC is activated while the pulse signal PHASE_PULSE is activated, and generates the digital code PHASE_CODE<0:9>. In FIG. 9, the digital code PHASE_CODE<0:9> is generated as 30. Referring to FIG. 9, both of the pulse signal PHASE_PULSE and the periodic wave OSC have a width eight times larger than in FIG. 7. Thus, the code generation unit 331 of FIG. 9 may operate with a larger margin than the code generation unit 331 of FIG. 7.

Figure 10:
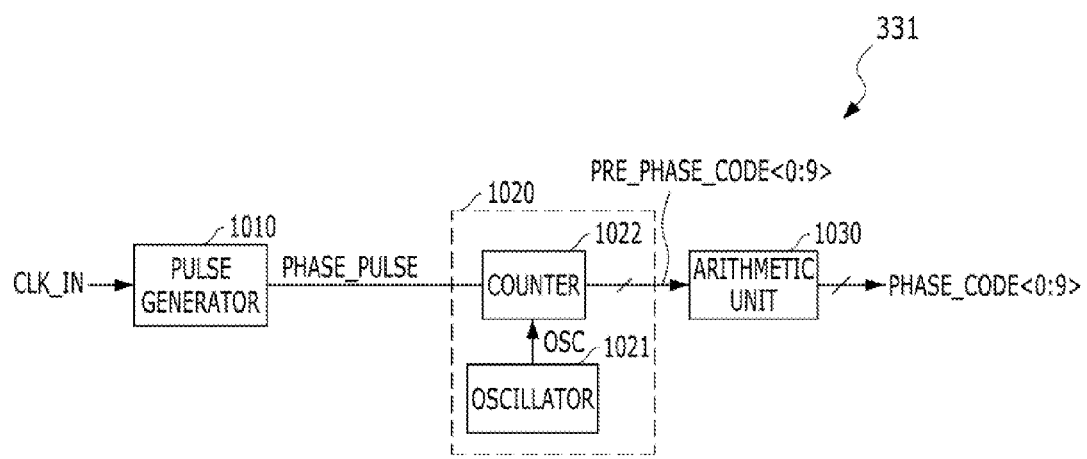
FIG. 10 is a block diagram illustrating a code generation unit in accordance with a third exemplary embodiment of the present invention.

FIG. 10 is a block diagram illustrating a code generation unit 331 in accordance with a third embodiment of the present invention. In accordance with the third embodiment, a method for securing the margins of the pulse signal PHASE_PULSE and the periodic wave OSC will be described.

Referring to FIG. 10, the code generation unit 331 includes a pulse generator 1010, a quantizer 1020, and an arithmetic unit 1030. The pulse generator 1010 receives a clock CLK_IN and generates a pulse signal PHASE_PULSE having a pulse width A times larger than the clock cycle where A is an integer equal to or more than one. For example, the pulse generator 1010 may generate a pulse signal PHASE_PULSE having a pulse width four times larger than the clock cycle. The pulse generator 1010 of FIG. 10 may include the pulse generator 610 of FIG. 6 and a divider (not illustrated).

The quantizer 1020 serves to quantize the pulse signal PHASE_PULSE by [the unit delay value*B] and generate a pre-digital code PRE_PHASE_CODE<0:9> where B is an integer equal to or more than two. The quantizer 1020 includes an oscillator 1021 and a counter 1022. The oscillator 1021 generates a periodic wave OSC having one cycle equal to [the unit delay value*B], and the counter 1022 counts how many times the periodic wave OSC is activated while the pulse signal PHASE_PULSE is activated, and generates the pre-digital code PRE_PHASE_CODE<0:9>.

The arithmetic unit 1030 serves to multiply the value of the pre-digital code PRE_PHASE_CODE<0:9> by 1/C and generate a digital code PHASE_CODE<0:9> (C=B/(A*BN)). The digital code PHASE_CODE<0:9> generated by the arithmetic unit 1030 has the same value as the digital codes PHASE_CODE<0:9> generated in FIGS. 6 and 8.

Figure 11:
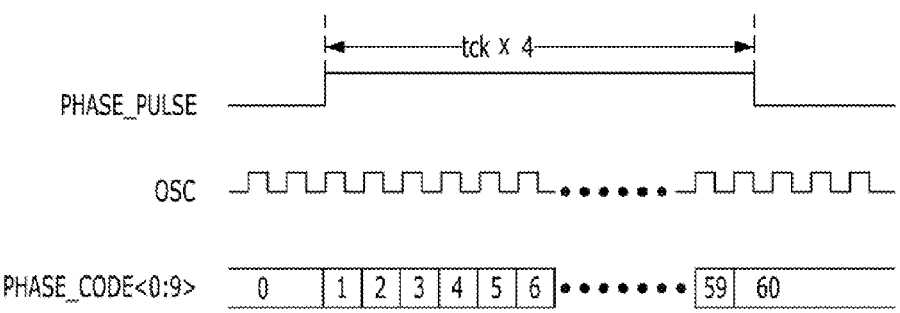
FIG. 11 is a timing diagram for explaining the operation of the code generation unit of FIG. 10.

FIG. 11 is a timing diagram for explaining the operation of the code generation unit 331 of FIG. 10. Referring to FIG. 11, the pulse generator 1010 generates a pulse signal PHASE_PULSE having a pulse width four times larger than the dock cycle. Furthermore, the oscillator 1021 generates a periodic wave OSC having one cycle equal to [the unit delay value*8]. The counter 1022 counts how many times the periodic wave OSC is activated while the pulse signal PHASE_PULSE is activated, and generates a pre-digital code PRE_PHASE_CODE<0:9> as 60. The pre-digital code is divided by two through the arithmetic unit, and the digital code is generated as 30. Referring to FIG. 11, the pulse signal PHASE_PULSE is generated to have a width two times larger than in FIG. 9, and the pre-digital code PRE_PHASE_C-ODE<0:9> is generated as 60. However, the pre-digital code is divided by two through the arithmetic unit 1030. Thus, the finally-generated digital code PHASE_CODE<0:9> has the same value as the digital code of FIG. 9.

Figure 12:
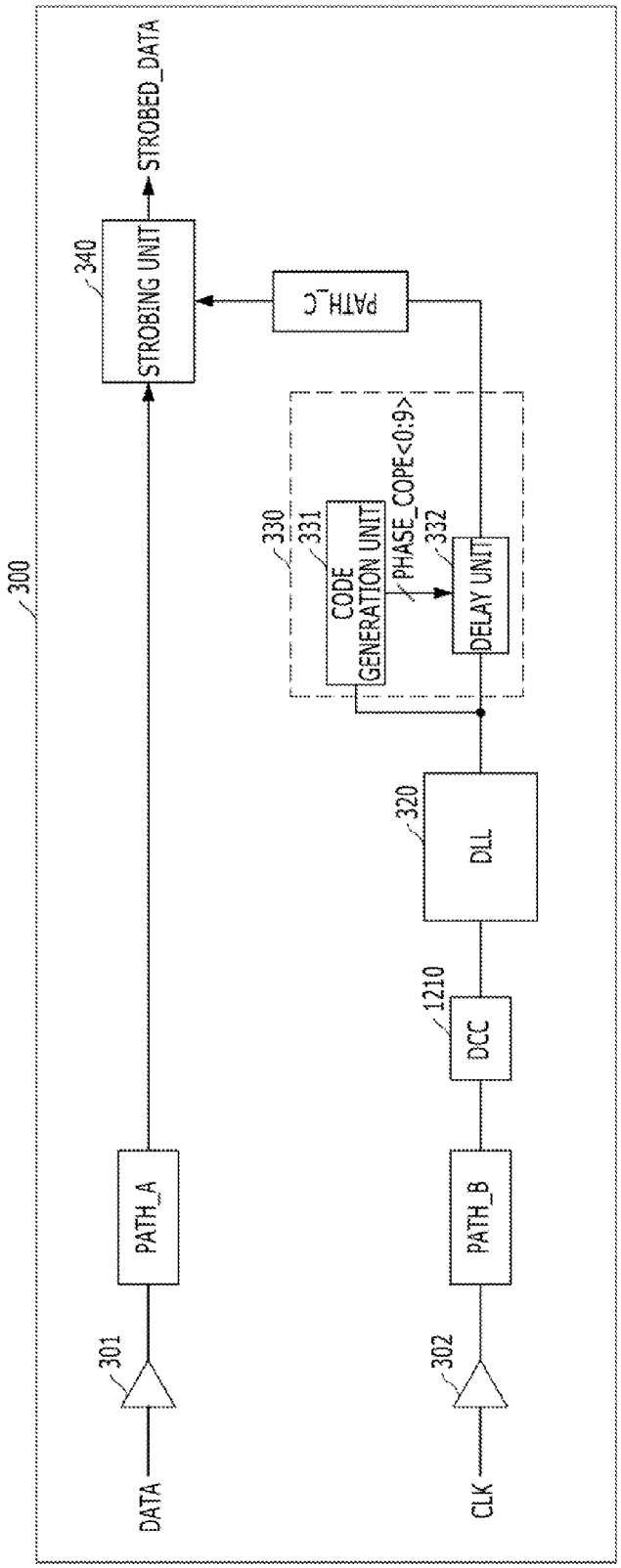
FIG. 12 is a block diagram of a semiconductor device in accordance with another embodiment of the present invention.

FIG. 12 is a block diagram of a semiconductor device in accordance with another embodiment of the present invention.

Referring to FIG. 12, the semiconductor device 300 further includes a duty cycle corrector (DCC) 1210 in addition to the components of the semiconductor device of FIG. 3. The duty cycle corrector 1210 serves to adjust the pulse width of the clock CLK such that a high pulse width and a low pulse width are equalized to each other. As the duty cycle corrector 1210 is added, the DLL 320, the clock phase adjusting circuit 330, and the strobing unit 340 may be more stably operated.

Figure 13:
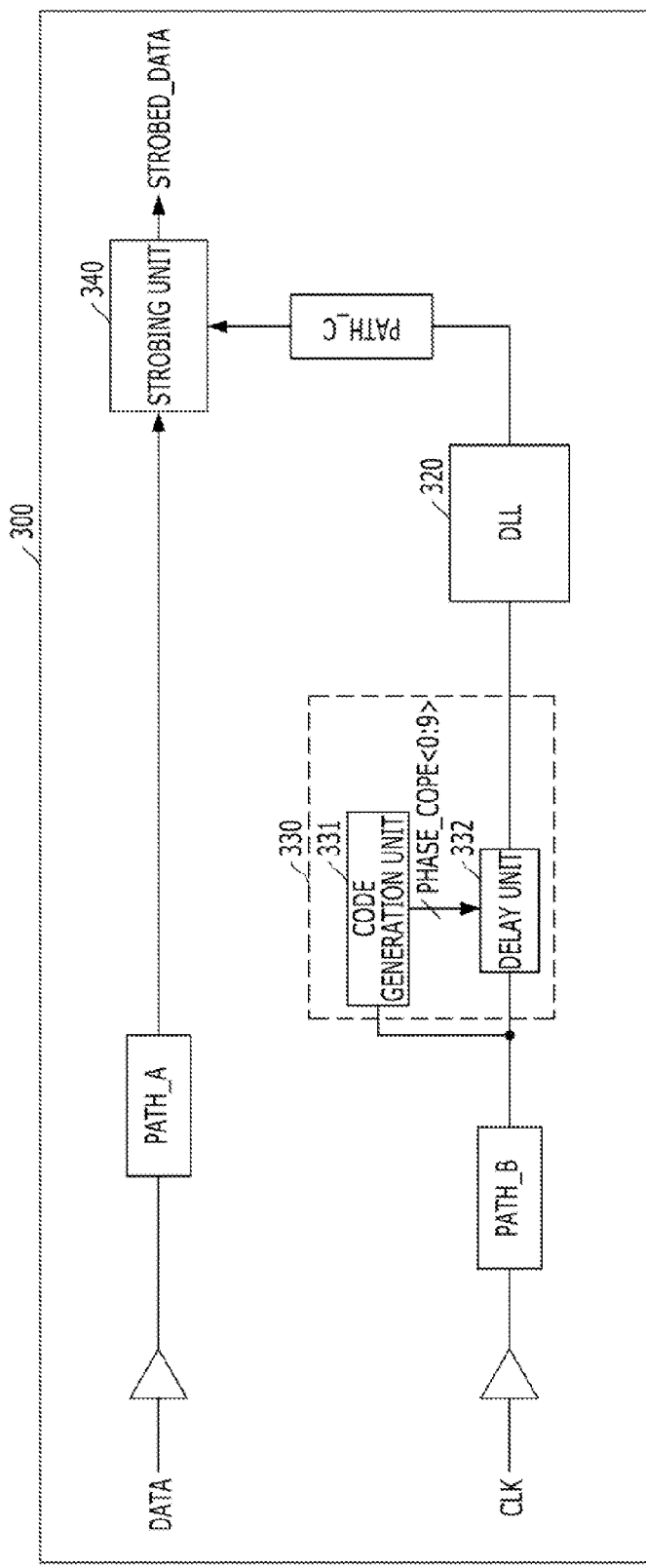
FIG. 13 is a block diagram of a semiconductor device in accordance with still another embodiment of the present invention.

FIG. 13 is a block diagram of a semiconductor device in accordance with still another embodiment of the present invention.

Referring to FIG. 13, the positions of the DLL 320 and the dock phase adjusting circuit 330 are exchanged in comparison to the semiconductor device of FIG. 3. In FIG. 13, the clock phase adjusting circuit 330 adjusts the phase of the dock CLK to a desired degree, and the DLL 320 corrects a phase difference between the dock CLK and the data DATA. The semiconductor device of FIG. 13 may further include the duty cycle corrector 1210 as illustrated in FIG. 12.

In accordance with the embodiments of the present invention, it may be possible to correct a phase difference caused by a phase difference between a clock and data (signal) and adjust the phase of the clock such that the edge of the clock is positioned at the center of the data.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a data buffer suitable for receiving an input signal from an external;
   a clock buffer suitable for receiving a clock;
   a first path suitable for transmitting the input signal from the data buffer;
   a second path suitable for transmitting the clock from the clock buffer;
   a delay locked loop (DLL) suitable for delaying the clock from the second path to generate a delay locked clock;
   a code generation unit suitable for generating a digital code corresponding to 1/N of the clock cycle where N is an integer equal to or more than two;
   a delay unit suitable for delaying the delay locked clock from the DLL by a value corresponding to the digital code to output a delayed clock;
   a third path suitable for transmitting the delayed clock from the delay unit; and
   a strobing unit suitable for strobing the input signal from the first path using the delayed clock from the third path,
   wherein the DLL delays the clock by [(M*tCK)−(B+C−A)], where M is an integer equal to or more than one, tCK is one cycle of the clock, B is a delay value of the second path, C is a delay value of the third path, and A is a delay value of the first path.

2. The semiconductor device of claim 1, wherein N is four.

3. The semiconductor device of claim 1, wherein the digital code comprises a code obtained by quantizing a delay value corresponding to 1/N of the clock cycle by using a unit delay value,
   the delay unit comprises a plurality of unit delays, and the number of unit delays used to delay the delay locked clock is set according to the digital code.

4. The semiconductor device of claim 3, wherein the code generation unit comprises:
   a pulse generator suitable for generating a pulse signal having a pulse width corresponding to 1/N of the clock cycle; and
   a quantizer suitable for quantizing the pulse signal by using the unit delay value, and generating the digital code.

5. The semiconductor device of claim 3, wherein the code generation unit comprises:
   a pulse generator suitable for generating a pulse signal having a pulse width X times larger than the clock cycle where X is an integer equal to or more than one; and
   a quantizer suitable for quantizing the pulse signal by using an equation defined as the unit delay value*Y and generating the digital code wherein Y is obtained by an equation defied as Y=X*N, B being an integer equal to or more than two.

6. The semiconductor device of claim 3, wherein the code generation unit comprises:
   a pulse generator suitable for generating a pulse signal having a pulse width X times larger than the clock cycle where X is an integer equal to or more than one;
   a quantizer suitable for quantizing the pulse signal by using an equation defined as the unit delay value*Y and generating a pre-digital code, Y being an integer equal to or more than two; and
   an arithmetic unit suitable for multiplying the pre-digital code by 1/Z and generating the digital code wherein Z is obtained by an equation defined as Z=Y/(X*N), Z being an integer equal to or more than two.

7. The semiconductor device of claim 1, further comprising a duty cycle corrector suitable for correcting the duty of the clock inputted to the clock buffer and transmitting the corrected clock to the DLL.

8. A semiconductor device comprising:
   a data buffer suitable for receiving an input signal from an external;
   a clock buffer suitable for receiving a clock;
   a first path suitable for transmitting the input signal from the data buffer;
   a second path suitable for transmitting the clock from the clock buffer;
   a code generation unit suitable for generating a digital code corresponding to 1/N of the clock cycle where N is an integer equal to or more than two;
   a delay unit suitable for delaying the clock from the second path by a value corresponding to the digital code to output a delayed clock;
   a DLL suitable for delaying the delayed clock and to generate a delay locked clock;
   a third path suitable for transmitting the delay locked clock from the DLL; and
   a strobing unit suitable for strobing the input signal from the first path using the delayed locked clock from the third path,
   wherein the DLL delays the delayed clock by [(M*tCK)−(B+C−A)], where M is an integer equal to or more than one, tCK is one cycle of the clock, B is a delay value of the second path, C is a delay value of the third path, and A is a delay value of the first path.

9. The semiconductor device of claim 8, wherein the digital code comprises a code obtained by quantizing a delay value corresponding to 1/N of the clock cycle by using a unit delay value,
   the delay unit comprises a plurality of unit delays, and the number of unit delays used to delay the delay locked clock is set according to the digital code.

10. The semiconductor device of claim 9, wherein the code generation unit comprises:
    a pulse generator suitable for generating a pulse signal having a pulse width corresponding to 1/N of the clock cycle; and
    a quantizer suitable for quantizing the pulse signal by using the unit delay value and generate the digital code.

11. The semiconductor device of claim 9, wherein the code generation unit comprises:
    a pulse generator suitable for generating a pulse signal having a pulse width X times larger than the clock cycle where X is an integer equal to or more than one; and
    a quantizer suitable for quantizing the pulse signal by using an equation defined as the unit delay value*Y and generating the digital code wherein Y is obtained by an equation defied as Y=X*N, B being an integer equal to or more than two.

12. The clock phase adjusting circuit of claim 9, wherein the code generation unit comprises:
    a pulse generator suitable for generating a pulse signal having a pulse width X times larger than the clock cycle where X is an integer equal to or more than one;
    a quantizer suitable for quantizing the pulse signal by using an equation defined as the unit delay value*Y and generating a pre-digital code, Y being an integer equal to or more than two; and
    an arithmetic unit suitable for multiplying the pre-digital code by 1/C and generating the digital code wherein Z is obtained by an equation defined as Z=Y/(X*N), Z being an integer equal to or more than two.

* * * * *